(12) United States Patent
Artmann et al.

(10) Patent No.: US 7,709,933 B2
(45) Date of Patent: May 4, 2010

(54) STRUCTURAL ELEMENT HAVING A POROUS REGION AT LEAST REGIONALLY PROVIDED WITH A COVER LAYER AND ITS USE AS WELL AS METHOD FOR SETTING THE THERMAL CONDUCTIVITY OF A POROUS REGION

(75) Inventors: Hans Artmann, Böblingen (DE);
Thorsten Pannek, Stuttgart (DE);
Hans-Peter Trah, Stuttgart (DE); Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 586 days.

(21) Appl. No.: 10/742,055

(22) Filed: Dec. 18, 2003

(65) Prior Publication Data
US 2004/0188808 A1 Sep. 30, 2004

(30) Foreign Application Priority Data
Dec. 23, 2002 (DE) ............................. 102 60 859

(51) Int. Cl.
*H01L 31/036* (2006.01)
(52) U.S. Cl. .................. 257/628; 257/627; 257/E31.04
(58) Field of Classification Search ................ 438/123; 257/627–628, E31.036
See application file for complete search history.

(56) References Cited

U.S. PATENT DOCUMENTS 5,430,300 A  7/1995 Yue et al.

2002/0121595 A1* 9/2002 Sunner et al. ............... 250/281
2003/0231304 A1* 12/2003 Chan et al. .................. 356/301
2004/0195096 A1* 10/2004 Tsamis et al. ............... 204/426

OTHER PUBLICATIONS

J.H. Sim et al., Sensors and Materials, vol. 11, No. 8, 1999, pp. 479-492.

* cited by examiner

Primary Examiner—Thanh Nguyen
(74) Attorney, Agent, or Firm—Kenyon & Kenyon LLP

(57) ABSTRACT

A structural element having a region of porous silicon or porous silicon oxide, which was obtained from a porization, starting from an edge area of the region, in at least largely crystalline silicon. Relative to the edge area, the crystalline silicon has a crystal orientation that has an orientation that differs from a <100> orientation or from an orientation that is equivalent for reasons of symmetry. This structural element is suited for use in a mass-flow sensor, in a component for the thermal decoupling of sensor and/or actuator structures, or a gas sensor. Furthermore, methods for setting the thermal conductivity of a region of porous silicon or porous silicon oxide of a structural element are described. In particular, in a porization of crystalline silicon, starting from an edge area of the region, the crystalline orientation of the silicon relative to the edge area is selected such that a thermal conductivity comes about along a direction perpendicular to the edge area that differs from, in particular is lower than, the thermal conductivity, that comes about in this direction in an otherwise analogous porization of crystalline silicon having a <100> orientation or an equivalent orientation relative to this edge area.

6 Claims, 1 Drawing Sheet

STRUCTURAL ELEMENT HAVING A POROUS REGION AT LEAST REGIONALLY PROVIDED WITH A COVER LAYER AND ITS USE AS WELL AS METHOD FOR SETTING THE THERMAL CONDUCTIVITY OF A POROUS REGION

FIELD OF THE INVENTION

The present invention relates to a structural element having a region of porous silicon or porous silicon oxide and its use as well as a method for setting the thermal conductivity of a region of porous silicon or porous silicon oxide of a structural body.

BACKGROUND INFORMATION

Porous silicon or porous silicon oxide is used in microsystem technology in particular in the form of a thick layer having poor thermal conductivity, for the thermal decoupling of sensor structures or actuator structures in components such as thermal, chemical or fluid sensors or gas sensors. The quality of the thermal decoupling, and thus the quality of the component, depends to a large degree on the thermal conductivity of the material used for the decoupling. Minimal thermal conductivity measured on oxidized porous silicon having still tenable mechanical stability lie in the range of 0.3 to 0.5 W/mK.

To produce porous silicon or porous silicon oxide, one utilizes an electrochemical reaction between hydrofluoric acid and silicon. In the process, a silicon layer or a silicon wafer is polarized anodically with respect to a hydrofluoric-acid electrolyte, so that a sponge-type structure is produced in the silicon, which has a large inner surface and other chemical and physical properties, such as lower thermal conductivity, than the surrounding bulk silicon.

SUMMARY

In accordance with an example embodiment of the present invention, a structural element is provided which has a region of porous silicon or porous silicon oxide, which has, in particular, reduced thermal conductivity compared to the related art, and by which better thermal decoupling of components applied on this region from the structural element may thus be attained, so that improvements in the functionality of thermal components, in particular, may be realized.

In the example structural element according to the present invention, the thermal conductivity may advantageously be modified in a direction that is perpendicular to an edge area, by using crystalline silicon having a suitable crystal orientation with respect to the edge area, this crystal orientation differing from a conventional <100> orientation, i.e., the thermal conductivity may be modified via the selected crystal orientation of the crystalline silicon. Thus, the thermal conductivity in this direction, perpendicular to the edge region, i.e., the thermal depth conductivity, is able to be set to a desired value relative to the thermal conductivity of a direction perpendicular thereto, i.e., a lateral thermal conductivity, and, in particular, is able to be reduced compared to the related art.

Overall, this results in lower thermal conductivity and, related thereto, in better thermal decoupling of thermal components, for example, arranged on the porous region.

Due to the slanted pore growth with respect to the edge area of the porous region, forced with the aid of the method according to the present invention, the effective length of the silicon crystallites in the porous region is increased in an advantageous manner. This also allows a desired effective thermal conductivity to be set in the porous region and preferably the setting of a reduced effective thermal conductivity of the porous silicon or the porous silicon oxide.

It may be advantageous if the crystalline silicon has an <111> orientation relative to the edge region, or, for reasons of symmetry, an orientation that is equivalent thereto, since such crystalline silicon is commercially available in the form of wafers. Also advantageous are an <118> orientation relative to the edge area, a <113> orientation, a <511> orientation, a <5,5,12> orientation or an orientation of the crystalline silicon that is equivalent thereto or equivalent for reasons of symmetry.

In addition, it may be advantageous if a cover layer is provided on the region of porous silicon or porous silicon oxide, the cover layer being made up of silicon nitride, in particular silicon-rich, non-stoichiometric silicon nitride. Such a cover layer not only has advantageous mechanical tension characteristics, but also the advantage that is able to provide especially satisfactory and reliable adhesion to a platinum layer system of which heating elements and/or sensor elements affixed on the cover layer, for example, are made.

An excess of silicon atoms in the non-stoichiometric silicon nitride, which are bound to the silicon-nitride surface in an immobile manner, provides so-called "Si dangling bonds", so that platinum is chemically bound to such silicon nitride in a very stable manner due to the formation of silicide-type bonding conditions.

In contrast to additional silicon adhesive layers or silicide adhesive layers, which also may be used to improve adhesion, the use of silicon-rich silicon nitride has the additional advantage that no harmful interdiffusion occurs between silicon and platinum causing electrical drift. This is due to the fact that the silicon in the silicon nitride is not freely mobile, but is chemically bound.

In particular, in this manner it is now advantageously possible to provide so-called platinum bondlands, i.e., platinum contact surfaces, directly on the cover layer and to bond a wire directly onto these, using gold wire and standard ultrasound bonding technology, for example. Such bonding connections to a platinum bondland are mechanically and chemically more robust than a bonding connection to a corresponding aluminum bondland, i.e., an aluminum contact area, since, in particular, they are not prone to corrosion effects caused by the entering of moisture.

BRIEF DESCRIPTION OF THE DRAWINGS

The present invention is explained in greater detail in the following description with reference to the drawings.

DESCRIPTION OF EXAMPLE EMBODIMENTS

Figure 1:
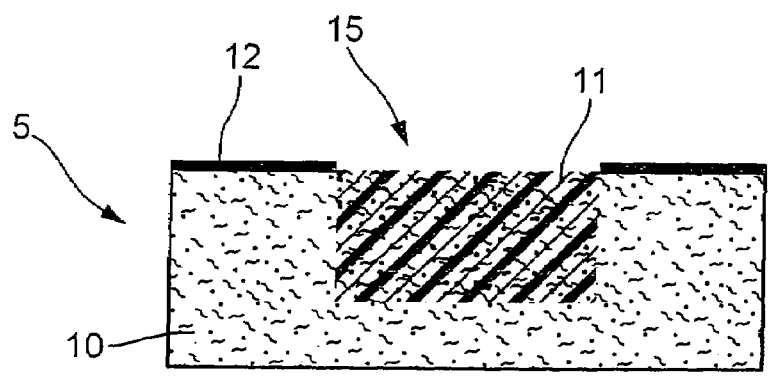
FIG. 1 shows a structural element having a porous region of silicon, in section.

The present invention is primarily based on the recognition that anisotropy occurs in thermal conductivity in porous silicon or porous silicon oxide that has been obtained by porization of a silicon wafer or a silicon layer having a <100> orientation. That is to say, the thermal conductivity parallel to the normal vector of an edge area of the region ("depth thermal conductivity") where the porization in the hydrofluoric acid electrolytes starts by anodic poling of the silicon wafer, differs markedly from the thermal conductivity in a direction perpendicular thereto ("lateral thermal conductivity"). These differences may reach a factor 2 and partially even more. It should be mentioned that the nomenclature <abc> or <100> for the orientation corresponds to the designation [abc] or [100] sometimes also used in crystallography.

In concrete terms, this results in the presence of "preferred heat paths" in the porous region of the structural element, which may be utilized to set the functionality of the structural element, or which, given inexpert settings, are able to substantially worsen the functionality of the structural element, for example with respect to the thermal insulation of components affixed to the porous region.

Moreover, it was noticed that during porization of this region the direction of pore growth in the porous silicon or porous silicon oxide depends not only on the extension of the equipotential lines during anodization, but also on the crystal orientation of the crystalline silicon used.

In silicon technology, a <100>-oriented silicon wafer is used as standard material, so that during porization, similarly to anisotropic etching in alkaline etching solutions, the silicon is preferably removed at (100) surfaces, while (111) surfaces have slower etching rates. Therefore, the etching depth in <111> direction, that is in a direction perpendicular to a (111) surface, is less than the etching depth in the <100> direction, given identical etching times. In most cases, the ratio of the etching rates in the discussed example is approximately 0,7.

This marked anisotropy in the pore growth is also reflected in the material characteristics of the region of porous silicon or, following its oxidation, of porous silicon oxide, and explains the aforementioned "preferred heat paths". In particular, thermal conductivities in a direction perpendicular to an edge area of the porous region, i.e., depth thermal conductivities, were measured during tests that exceeded, by the factor 2.5, the thermal conductivities in a direction parallel to this edge area, i.e., the lateral thermal conductivities.

These findings concerning an anisotropic thermal conductivity, which is caused by the crystal orientation of the crystalline silicon used, that is, a preferred direction in the pore growth during porization, form the foundation for the method according to the present invention for setting the thermal conductivity of the region of porous silicon or porous silicon oxide of the structural element.

The starting point of the present invention is, first of all, the use of a silicon substrate or silicon wafer not having <100> orientation, or a corresponding silicon layer, so that a preferred pore growth in a direction perpendicular to the surface of the crystalline silicon substrate may be avoided during porization. Instead, the effective length of the crystallites in the direction perpendicular to the surface of the crystalline silicon substrate is now increased via a preferably slanted pore growth induced via the crystal orientation of the silicon. In this way the effective thermal conductivity of the porous silicon or porous silicon oxide in the direction perpendicular to the surface of the crystalline silicon substrate ("depth thermal conductivity") is reduced.

When using a crystalline silicon substrate having other than <100> orientation, and this must be understood to include orientations that are equivalent for reasons of symmetry, the pores that form during the usual electrochemical porization with the aid of a hydrofluoric acid electrolyte, continue to grow in the silicon substrate, preferably perpendicularly to the (100) surface. However, this plane is now no longer at a 90° angle with respect to the edge area of the porous region to be formed, but, for example in the case of a (111) surface of the silicon substrate, at an angle of 55° relative to this edge area.

Since, as discussed, the preferred direction of pore growth, and thus the preferred direction of the silicon skeleton in the porous region as well, are clearly correlatable to the thermal conductivity, the direction of maximum pore growth and the direction of maximum thermal conductivity have the same orientation, namely a <100> direction.

Utilizing the crystal orientation of the used crystalline silicon, it is then possible to selectively modify the depth thermal conductivity of the region of porous silicon or porous silicon oxide with respect to the edge area from where the porization started, in particular relative to the lateral thermal conductivity.

Crystalline silicon having a <111> crystal orientation is preferably used since it is commercially available. The porous silicon or porous silicon oxide thus produced, optimized in its thermal properties, or the structural element having a corresponding porous region, may then be utilized to construct thermal components such as especially sensitive mass-flow sensors or it may be used in components for the thermal decoupling of sensor and/or actuator structures or gas sensors.

FIG. 1 explains a structural element 5 having a crystalline silicon layer 10 or a silicon wafer on whose surface a patterned masking layer 12 is situated, which defines a freely accessible surface of silicon layer 10 denoted as edge area 15. Furthermore, FIG. 1 shows how, starting from edge area 15, a porous region 11 having porous silicon has been produced with the aid of electrochemical anodization in a hydrofluoric acid electrolyte, structural element 5 having been anodically poled.

In the discussed example, silicon layer 10 has a <111> crystal orientation with respect to edge area 15. The thickness of silicon layer 10 is preferably 1 µm to 1000 µm, for example 100 µm to 500 µm.

Figure 2:
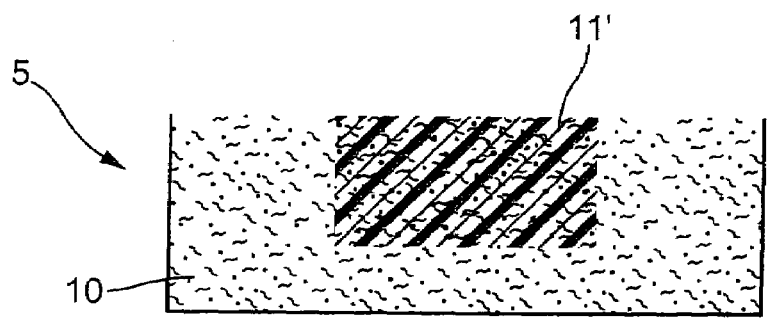
FIG. 2 shows, in continuation of FIG. 1, a structural element having a region of porous silicon oxide.

FIG. 2, in continuation of FIG. 1, shows how the porous silicon present in porous region 11 has been converted into porous silicon oxide by an oxidation process at temperatures of between 300 to 500 degrees Celsius, thereby producing an oxidized porous region 11' that is stabilized in its structure and has thermal conductivity that is further reduced compared to porous region 11. This, incidentally, is also a function of the degree of porosity and the crystallite size.

Figure 3:
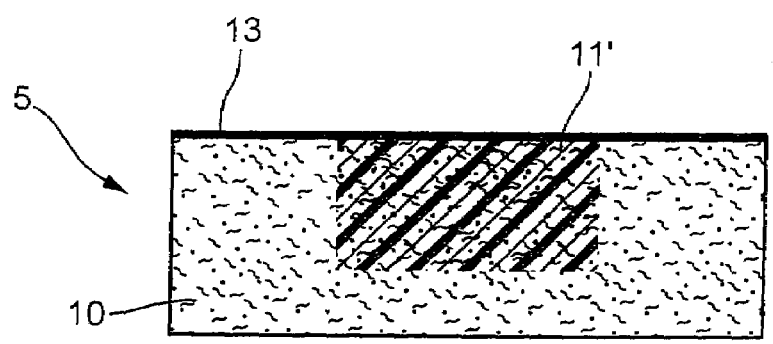
FIG. 3 shows, in continuation of FIG. 2, a structural element having an additional cover layer.

FIG. 3 then shows how, starting from FIG. 2, the region having oxidized porous silicon, 11', is sealed by a cover layer 13, for example silicon nitride ($Si_xN_y$) deposited via a CVD process ("chemical vapor deposition"). Silicon-rich, non-stoichiometric silicon nitride is preferably deposited.

Figure 4:
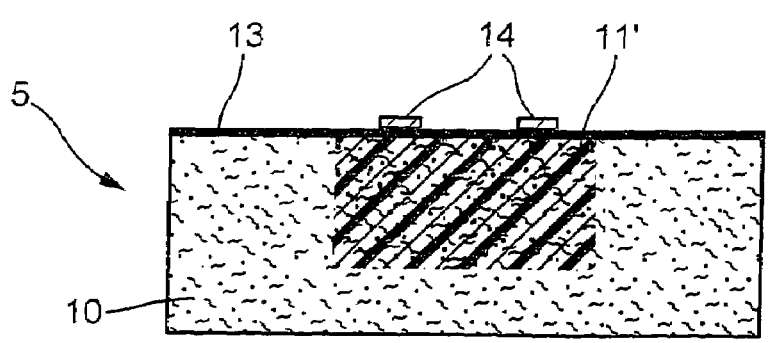
FIG. 4 shows, in continuation of FIG. 3, a structural element having additional sensor elements or platinum circuit traces on the cover layer.

According to FIG. 4, sensor elements 14 and/or actuator elements (not shown) and/or circuit-trace elements (not shown) are additionally affixed on cover layer 13.

For instance, sensor elements 14 are platinum resistor circuit traces, which are connected to the surface of cover layer 13 in a chemically very stable manner by the formation of silicide-type bonding conditions, so that they form a connection providing excellent adhesion.

Alternatively or in addition, so-called platinum bondlands or platinum contact areas may also be applied to cover layer 13, so that it is possible to wire-bond directly onto these areas, which is preferably done using gold wire and standard ultrasound bonding technology.

What is claimed is:

1. A structural element having a region of porous silicon or porous silicon oxide which has been obtained via porization, comprising:
   at least largely crystalline silicon having a crystal orientation that, starting from an edge area, differs from a <100>, wherein:
   the region is at least regionally provided with a cover layer, at least one of sensor elements, actuator elements, and circuit-trace elements being regionally arranged directly on the cover layer,
   the thermal conductivity of the region of porous silicon or porous silicon oxide is lower along a direction perpendicular to the edge area than a thermal conductivity of an analogous region of porous silicon or porous silicon oxide, which was obtained via an analogous porization, the analogous region including crystalline silicon, which, starting from an edge area, has a <100> orientation.

2. The structural element as recited in claim 1, wherein the region forms a surface of the structural element at least regionally.

3. The structural element as recited in claim 1, wherein the region has pores that are oriented at least partially along a preferred direction, the preferred direction extending at least approximately in parallel to the crystal orientation of the crystalline silicon.

4. The structural element as recited in claim 1, wherein the crystalline silicon, with respect to the edge area, has one of a <111> orientation, a <118> orientation, a <113> orientation, a <511> orientation, a <5,5,12> orientation or an orientation that is equivalent to one of the <111>, <118>, <511> and <5, 5, 12> orientations.

5. The structural element as recited in claim 1, wherein the cover layer includes silicon nitride.

6. The structural element as recited in claim 1, wherein one of a layer, a layer system or a component, is arranged on the cover layer, the one of the layer, layer system or component containing platinum.

* * * * *